United States Patent [19]
Wu et al.

[11] Patent Number: 6,115,443
[45] Date of Patent: Sep. 5, 2000

[54] PROGRAMMABLE FREQUENCY FOLLOWING DEVICE

[75] Inventors: Hsu-Yun Wu, Tainan Hsien; Hsin-Lung Yang, Hsinchu, both of Taiwan

[73] Assignee: Winbond Electronics Corp., Hsinchu, Taiwan

[21] Appl. No.: 09/299,720

[22] Filed: Apr. 26, 1999

[30] Foreign Application Priority Data

Oct. 28, 1998 [TW] Taiwan .................................. 87217815

[51] Int. Cl.$^7$ ...................................................... H03K 21/00
[52] U.S. Cl. .............................................. 377/47; 327/115
[58] Field of Search ............................. 377/47; 327/156, 327/159, 160, 115

[56] References Cited

U.S. PATENT DOCUMENTS

| | | | |
|---|---|---|---|
| 4,244,043 | 1/1981 | Fujita et al. | ................................ 368/85 |
| 5,202,906 | 4/1993 | Saito et al. | .................................. 331/14 |

*Primary Examiner*—Margaret R. Wambach
*Attorney, Agent, or Firm*—Jiawei Huang; J.C. Patents

[57] ABSTRACT

A programmable frequency following device is provided. The programmable frequency following device includes a frequency divider for dividing the input frequency by a predetermined divisor. A frequency counter is used to count the output frequency of the programmable frequency following device, the frequency counter being reset to 0 after reaching a cycle time of the output frequency from the frequency divider. A programmable frequency comparator is used to compare the output count from the frequency counter with a user-programmable reference value at the time before the frequency counter is reset to 0. An up-down counter is under control by the programmable frequency comparator to count either in the upward or downward direction, and the count is locked when the output frequency reaches an intended value. A digitally controlled oscillator (DCO) is coupled to the up-down counter, and whose output frequency is inversely proportional to the output count from the up-down counter, and whose output frequency serves as the output frequency of the programmable frequency following device. The output frequency from this programmable frequency following device is programmable through firmware or software means and can be varied in a real-time manner through microprocessor control without having to replace the external oscillator that serves as clock generator.

20 Claims, 5 Drawing Sheets

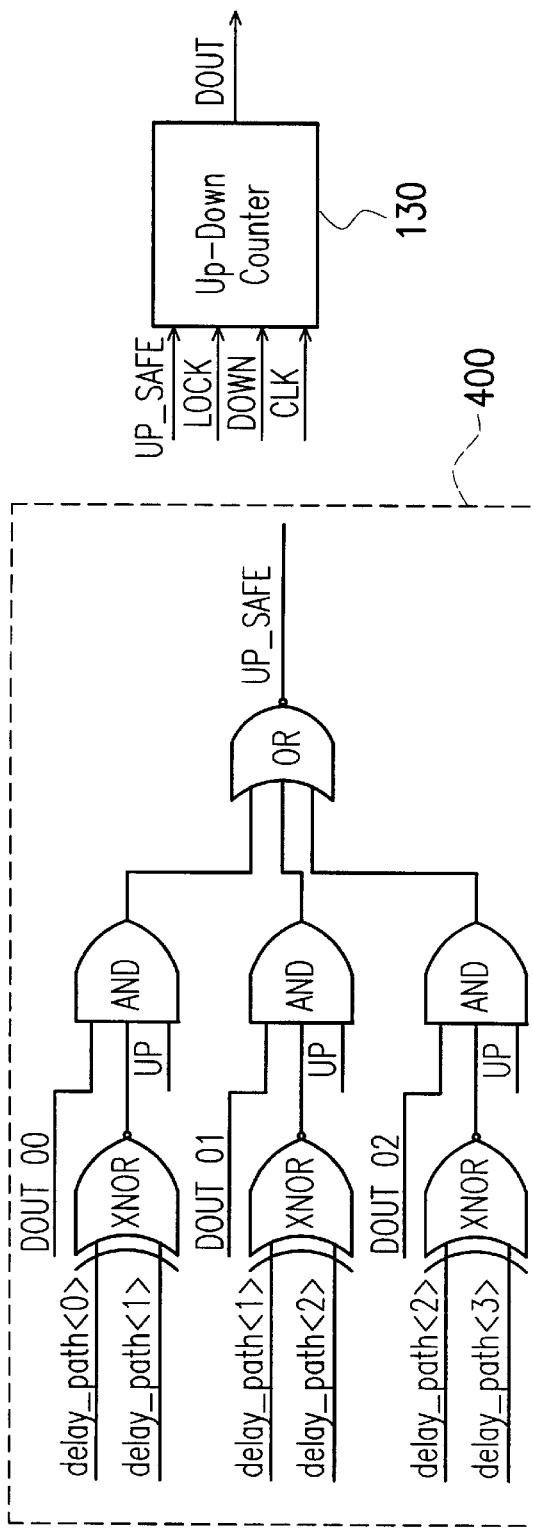
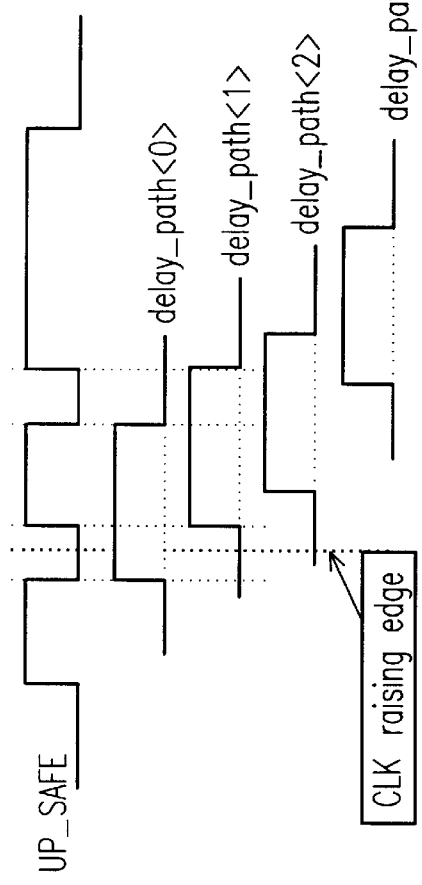
FIG. 4A
FIG. 4B

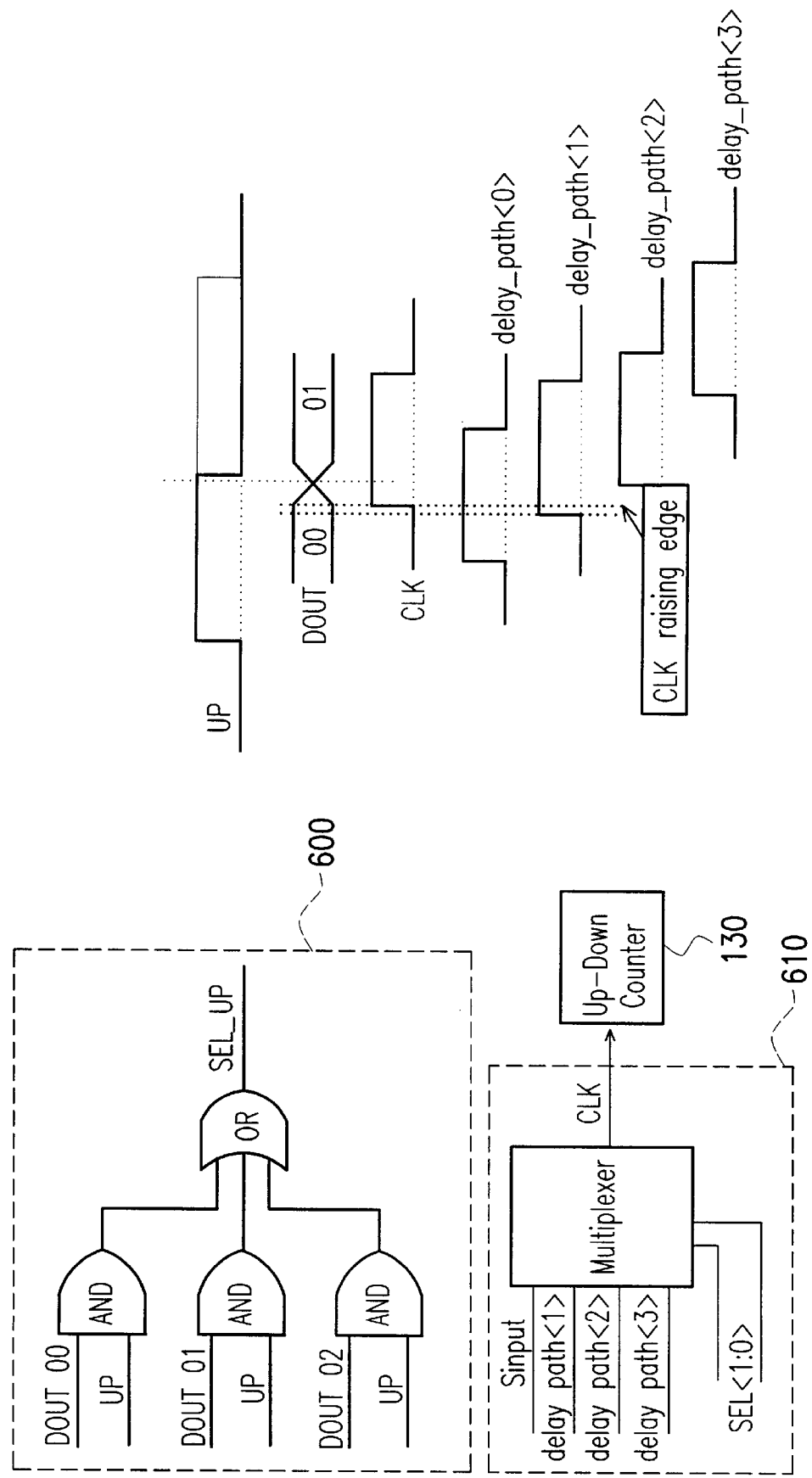

PROGRAMMABLE FREQUENCY FOLLOWING DEVICE

CROSS-REFERENCE TO RELATED APPLICATION

This application claims the priority benefit of Taiwan application Ser. No. 87217815, filed Oct. 28, 1998.

BACKGROUND OF THE INVENTION

1. Field of the Invention

This invention relates to CD-ROM (compact disc read-only memory) technology, and more particularly, to a programmable frequency following device which can be utilized on a CD-ROM drive with an operating frequency range of from 33 MHz to 66 MHz (megahertz), and which is capable of being programmed to any desired frequency in the 33–66 MHz range through software/firmware setting and microprocessor control without having to replace the associated external oscillator that is used to generate the system clock signal.

2. Description of Related Art

A CD-ROM drive is a widely used mass data storage device for a personal computer (PC). During read operation, the data read from the CD-ROM are first decoded through a digital signal processor (DSP) and then transferred to the RAM of the PC for processing. The performance of a CD-ROM drive is dependent on the frequency of the clock signal used to drive the CD-ROM drive—the higher the clock frequency, the higher is the performance of the CD-ROM drive. Therefore, the stability of the clock generator for the CD-ROM drive is a primary concern in CD-ROM technology.

Conventionally, a CD-ROM drive uses an oscillator to generate a clock signal which is then either directly used to drive the CD-ROM drive or multiplied in frequency before being used. The frequency multiplication is conventionally achieved by using a phase-locked loop (PLL) circuit. Beside frequency multiplication, there are some new circuits that can be used to generate a high-frequency clock signal.

These conventional clock generators, however, are mostly based on analog circuitry. One drawback to the use of analog clock generators is that they are complex in circuit structure and would be low in stability. Moreover, since today's information processing systems are largely based on digital circuitry, an analog circuit would be less easily to be integrated to a digital system. Therefore, there exits a need for a programmable frequency following device that is based on digital circuitry so that it would be easily integrated to any digital systems.

SUMMARY OF THE INVENTION

It is therefore an objective of the present invention to provide a programmable frequency following device, which is simple in circuit structure through the use of silicon gates.

It is another objective of the present invention to provide a programmable frequency following device, which is implemented with a digital closed-loop system.

It is still another objective of the present invention to provide a programmable frequency following device whose output frequency is programmable through firmware/software means and can be varied in a real-time manner through microprocessor control without having to replace the external oscillator.

In accordance with the foregoing and other objectives of the present invention, a new programmable frequency following device is provided. The programmable frequency following device of the invention includes a frequency divider, a frequency counter, a programmable frequency comparator, an up-down counter and a DCO. The frequency divider is provided for dividing the input frequency by a predetermined divisor. The frequency counter is provided for counting the output frequency of the programmable frequency following device, the frequency counter being reset to 0 after reaching a cycle time of the output frequency from the frequency divider. The programmable frequency comparator is provided for comparing the output count from the frequency counter with a user-programmable reference value at the time before the frequency counter is reset to 0 in such a manner that, if the output count is greater than the reference value, the programmable frequency comparator generates an up-trigger signal; if the output count is less than the reference value, the programmable frequency comparator generates an down-trigger signal; and if the output count is equal to the reference value, the programmable frequency comparator generates a lock signal. The up-down counter is capable of increasing its count in response to the up-trigger signal from the programmable frequency comparator, decreasing its count in response to the down-trigger signal from the programmable frequency comparator, and locking its count at current value in response to the lock signal from the programmable frequency comparator. The output of the DCO frequency is inversely proportional to the output count from the up-down counter, and the output frequency of the DCO serves as the output frequency of the programmable frequency following device. Bye means of the setting of the user-programmable reference value, the output frequency of the programmable frequency following device can be varied in a real-time manner through microprocessor control without having to replace the external oscillator.

The user-programmable reference value can be set through software or firmware means, allowing the user to program the output frequency as desired.

Moreover, the programmable frequency following device of the invention further comprises a frequency-doubling circuit coupled between the DCO and the frequency counter, for doubling the output frequency from the DCO before being fed to the frequency counter for frequency counting.

Still moreover, the programmable frequency following device of the invention can be additionally provided with a ripple-prevention control circuit that can help prevent the occurrence of ripples in the switching signal used to control the DCO.

BRIEF DESCRIPTION OF DRAWINGS

The invention can be more fully understood by reading the following detailed description of the preferred embodiments, with reference made to the accompanying drawings, wherein:

FIG. 4A shows a first example of a ripple-prevention control circuit utilized in the programmable frequency following device of the invention;

FIG. 4B is a signal waveform diagram showing the timing relationship between various signals used in the circuit of FIG. 4A;

FIG. 6A shows a third example of a ripple-prevention control circuit utilized in the programmable frequency following device of the invention;

FIG. 6B is a signal waveform diagram showing the timing relationship between various signals used in the circuit of FIG. 6A;

DETAILED DESCRIPTION OF PREFERRED EMBODIMENTS

The invention provides a programmable frequency following device which can be utilized on a CD-ROM drive with an operating frequency range of from 33 MHz to 66 MHz and is capable of being programmed to any desired frequency in the 33–66 MHz range through software/firmware setting and microprocessor control without having to replace the external oscillator that is used to generate the system clock signal.

Figure 1:
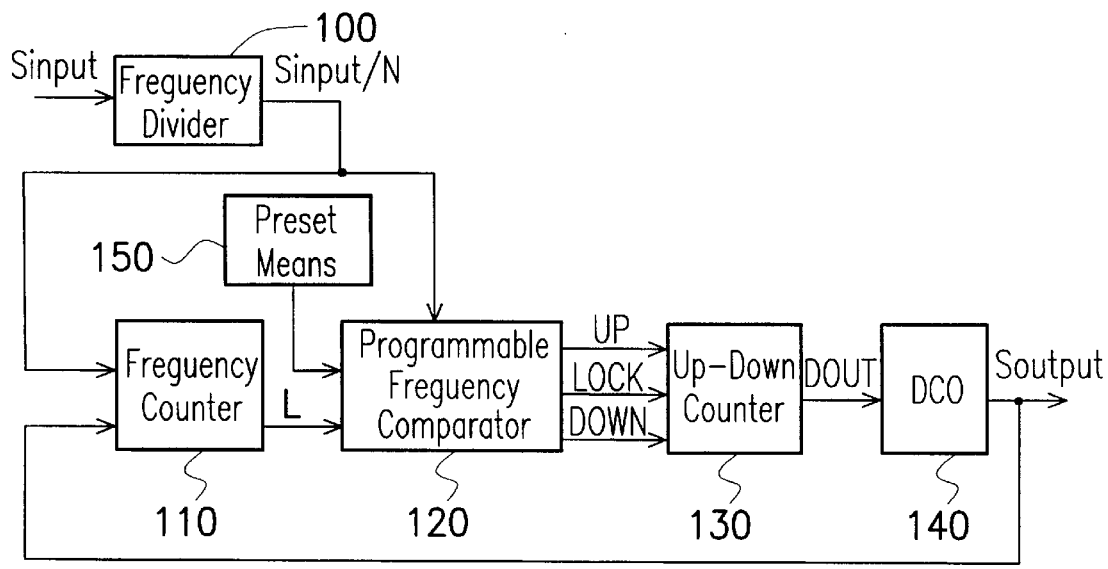
FIG. 1 is a schematic block diagram of the programmable frequency following device of the invention.

FIG. 1 is a schematic block diagram showing the basic system architecture of the programmable frequency following device of the invention. As shown, the programmable frequency following device of the invention includes a frequency divider 100, a frequency counter 110, a programmable frequency comparator 120, an up-down counter 130, and a digitally-controlled oscillator (DCO) 140. The frequency divider 100 receives an input frequency $S_{input}$ and, in response, is capable of generating an output frequency $S_{output}$ where $S_{output}$ is a user-preprogrammed multiple of $S_{input}$.

At the initialization, the count L of the frequency counter 110 is set to 0 and the count DOUT of the up-down counter 130 is set to a predetermined value that allows the DCO 140 to generate an output frequency $S_{output}$ within a predetermined frequency range. The output frequency $S_{output}$ from the DCO 140 is directly used to serve as the output frequency of the programmable frequency following device of the invention.

During operation, the frequency counter 110 counts the output frequency $S_{output}$ from the DCO 140 and outputs the count L to the programmable frequency comparator 120. The frequency counter 110 operates in such a manner that it will be reset to 0 after reaching a cycle time T of the output frequency $S_{input}/N$ from the frequency divider 100, where $T=N/S_{input}$; and at the same time, the count L of the frequency counter 110 will be latched by the programmable frequency comparator 120 (the latched count is herein-after represented by $L_{Latch}$) The programmable frequency comparator 120 then compares the latched count $L_{Latch}$ with a user-programmable reference value K which is a positive integer value presettable by the user through software or firmware means. User-programmable reference value K is set by a preset means 150, that is this invention provides the preset means 150 for setting the user-programmable reference value K. There are three possibilities of the comparison: (1) $L_{Latch}>K$, (2) $L_{Latch}<K$, and (3) $L_{Latch}=K$, which are respectively discussed in the following.

$$L_{Latch}>K \quad (1)$$

In the condition that $L_{Latch}>K$, it indicates that the output frequency $S_{output}$ from the programmable frequency following device of the invention is greater than the intended value. This condition causes the programmable frequency comparator 120 to output an up-trigger signal UP which can trigger the up-down counter 130 to count in the upward direction, thereby gradually increasing the output count DOUT. Since the output frequency $S_{output}$ is inversely proportional to the output count DOUT, the output frequency $S_{output}$ gradually decreases as the output count DOUT from the up-down counter 130 is increasing.

$$L_{Latch}<K \quad (2)$$

In the condition that $L_{Latch}<K$, it indicates that the output frequency $S_{output}$ is below the intended value. This condition causes the programmable frequency comparator 120 to output a down-trigger signal DOWN which can trigger the up-down counter 130 to count in the downward direction, thereby gradually decreasing the output count DOUT. Since the output frequency $S_{output}$ is inversely proportional to the output count DOUT, the output frequency $S_{output}$ increases as the output count DOUT from the up-down counter 130 is decreasing.

$$L_{Latch}=K \quad (3)$$

In the condition that $L_{Latch}=K$, it indicates that the output frequency $S_{output}$ is exactly equal to the intended value. This condition causes the programmable frequency comparator 120 to output a lock signal LOCK which can lock the up-down counter 130 at the current output count DOUT, thereby keeping the output frequency $S_{output}$ at its current value.

When the condition of $L_{Latch}=K$ is achieved, the output frequency $S_{output}$ is exactly equal to the input frequency $S_{input}$ times K/N, i.e., $$S_{output}=(K/N)*S_{input}$$

Accordingly, the output frequency $S_{output}$ can be programmed to the desired value simply by adjusting K to a suitable value.

Various preferred embodiments of the invention based on the foregoing principle are disclosed in the following.

Programmable Frequency Output

The invention provides a programmable frequency following device which is capable of generating an output frequency whose value is programmable through software or firmware means. FIG. 1 shows the basic system architecture of this programmable frequency following device, which can generate an output frequency $S_{output}$ whose value is a user-programmable multiple K/N of the input frequency $S_{input}$, where N is the frequency divisor of the frequency divider 100, and K is a user-programmable reference value to the programmable frequency comparator 120.

In operation, the input frequency $S_{input}$ is first divided by the frequency divider 100 by N into $S_{input}/N$ and then input to the frequency counter 110. The frequency counter 110 then starts counting the number of the pulses in the output frequency $S_{output}$ from the DCO 140 and outputs the count L to the programmable frequency comparator 120. The frequency counter 110 operates in such a manner that it will be reset to 0 after reaching a cycle time T of the output frequency $S_{input}/N$ where $T=N/S_{input}$; and at the same time, the count L of the frequency counter 110 before being reset to 0 will be latched by the programmable frequency comparator 120. The programmable frequency comparator 120 then compares the latched count $L_{Latch}$ with the reference value K in such a manner that, if $L_{Latch}>K$, the programmable frequency comparator 120 outputs an up-trigger signal UP to the up-down counter 130; if $L_{Latch}<K$, the programmable frequency comparator 120 outputs an down-trigger signal DOWN to the up-down counter 130; and if $L_{Latch}=K$, the programmable frequency comparator 120 outputs a lock signal LOCK to the up-down counter 130 to lock the current count.

It can be theoretically deduced that $$S_{output}=(K/N)*S_{input}$$

Therefore, for a desired output frequency $S_{output}$ from a fixed input frequency $S_{input}$, the reference value K should be set as follows:

$$K = \frac{S_{output} * N}{S_{input}}$$

For example, assume it is desired to set $S_{output}=45$ MHz for $S_{input}=24$ MHz, then if the frequency divider 100 has N=16, K should be set as follows:

$$K = \frac{45*16}{24} = 30$$

Enhancing Output Frequency Accuracy

Figure 2A:
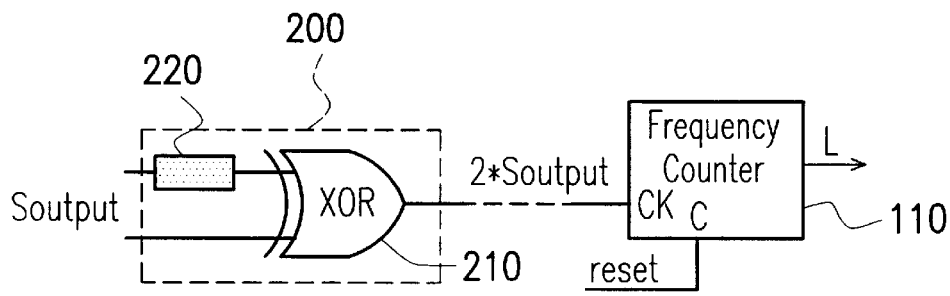
FIG. 2A is a schematic diagram showing the incorporation of a frequency-doubling circuit to the frequency counter utilized in the programmable frequency following device of the invention.
Figure 2B:
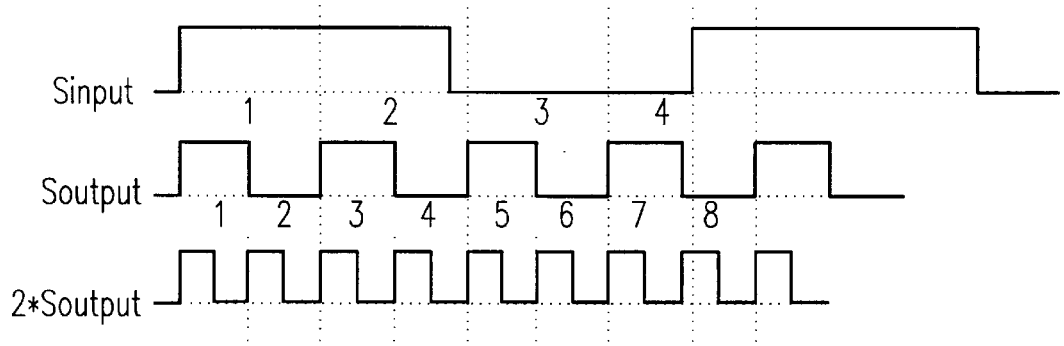
FIG. 2B is a signal waveform diagram showing the timing relationship between various signals used in the invention.

To enhance the accuracy of the output frequency $S_{output}$, the output frequency $S_{output}$ can be multiplied before it is being counted by the frequency counter 110. A scheme to achieve this objective is shown in FIGS. 2A–2B. As shown, a frequency-doubling circuit 200 is connected to the CK (clock) input port of the frequency counter 110. The frequency-doubling circuit 200 is composed of an XOR (exclusive-OR) gate 210 and a delay cell 220. The XOR gate 210 has a first input end connected to receive the output frequency $S_{output}$ from the DCO 140 and a second input end connected to the delay cell 220. This frequency-doubling circuit 200 is a well-known circuit, so detailed operation thereof will not be described. It is to be noted that, when this frequency-doubling circuit 200 is used, the user-programmable reference value K should be correspondingly doubled so as to keep the output frequency $S_{output}$ unchanged. By this scheme, the output frequency $S_{output}$ can be more accurately produced.

Ripple Prevention and Frequency Locking

Figure 3:
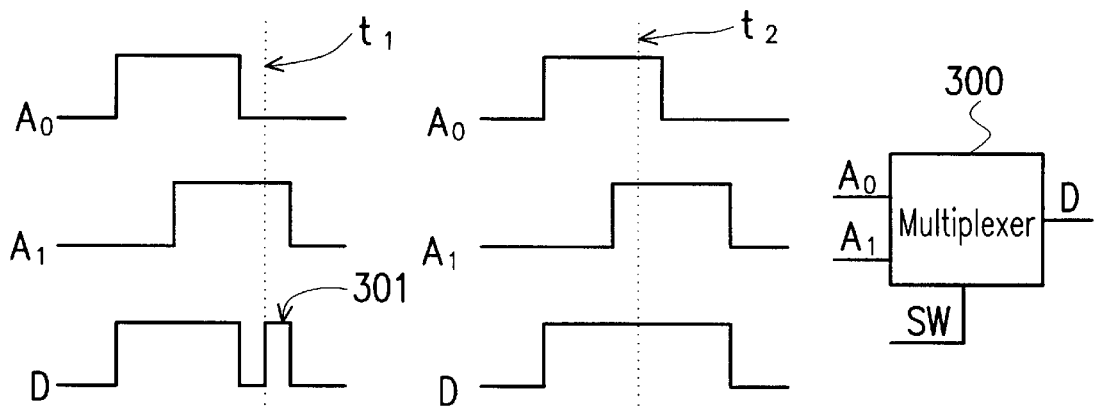
FIG. 3 is a schematic diagram used to explain the reason of the occurrence of a ripple in the output from a multiplexer.

During operation of the programmable frequency following device, undesired ripples can occur when the up-down counter 130 is counting in the upward direction. The occurrence of ripples 301 is depicted in FIG. 3. As shown, at the DCO switching time $t_2$, the output signal from the multiplexer 300 (which is used to control the switching of the DCO 140) is normal; whereas, at the switching time $t_1$, the output signal will include a ripple 301 due to glitch.

A solution to the foregoing problem is shown in FIG. 4A, which is referred to as a ripple-prevention control circuit and designated by the reference numeral 400; and FIG. 4B is a signal waveform diagram showing the timing relationship between various signals used in the circuit of FIG. 4A. As shown, the ripple-prevention control circuit 400 is designed to generate an output UP_SAFE signal in response to the input signals delay_path<0>, delay_path<1>, delay_path<2>, and delay_path<3> which are taken from the delay paths in the DCO 140. The UP_SAFE signal is connected to the UP input end of the up-down counter 130 shown in FIG. 1. When the UP_SAFE signal is at high-voltage logic state, it will trigger the up-down counter 130 to count in the upward direction. The ripple-prevention control circuit 400 is designed to operate in such a manner that the UP_SAFE signal is switched to high-voltage logic state only when any neighboring pair of the delay paths in the DCO 140 are switched to the same logic state, either high or low. For example, when the pair of delay_path<0> and delay_path<1>, or the pair of delay_path<1> and delay_path<2>, or the pair of delay_path<2> and delay_path<3>, are switched to the same logic state, the UP_SAFE signal is switched to the high-voltage logic state, as illustrated in the signal waveform diagram of FIG. 4B. This can help prevent the occurrence of ripples in the output signal.

Figure 5A:
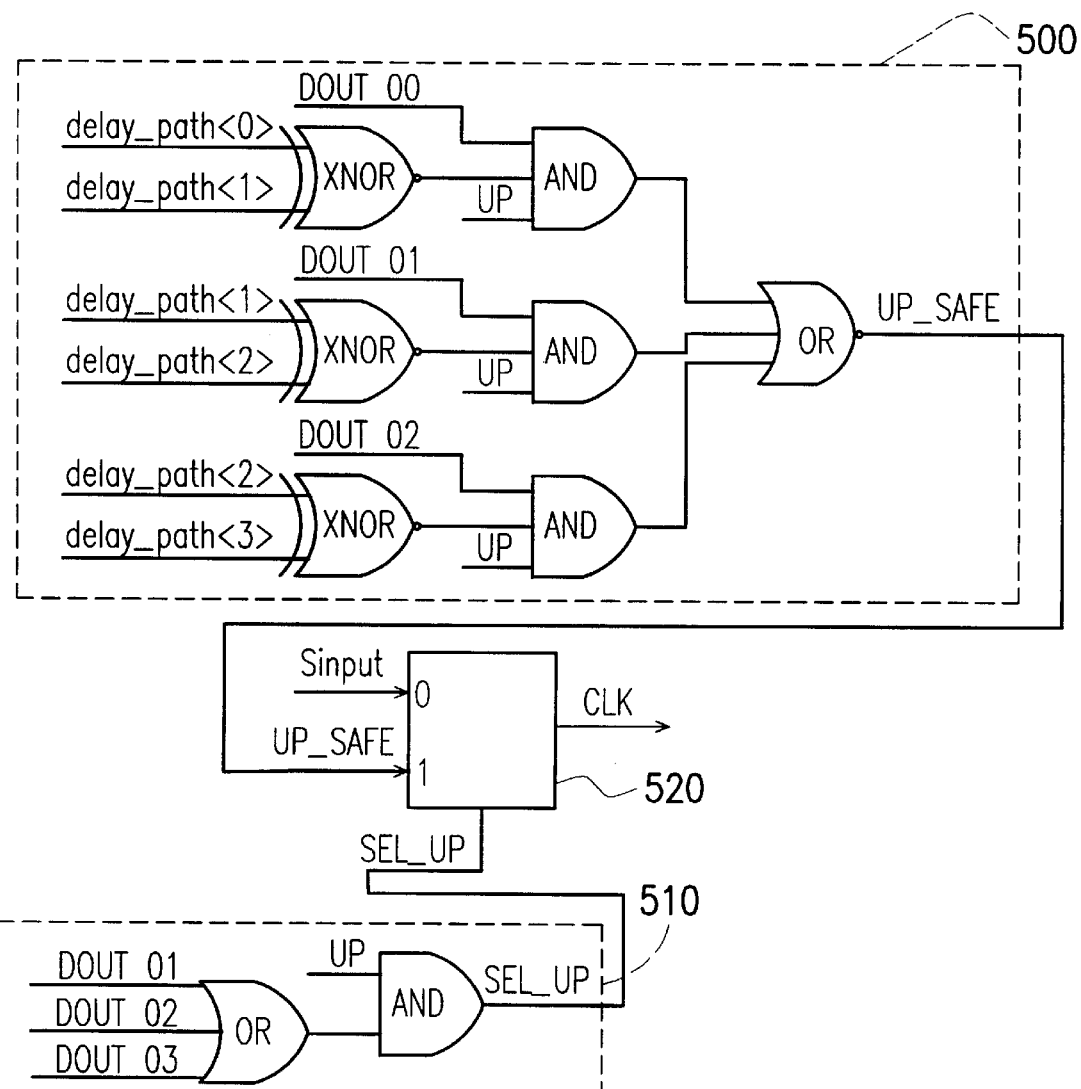
FIG. 5A shows a second example of a ripple-prevention control circuit utilized in the programmable frequency following device of the invention.
Figure 5B:
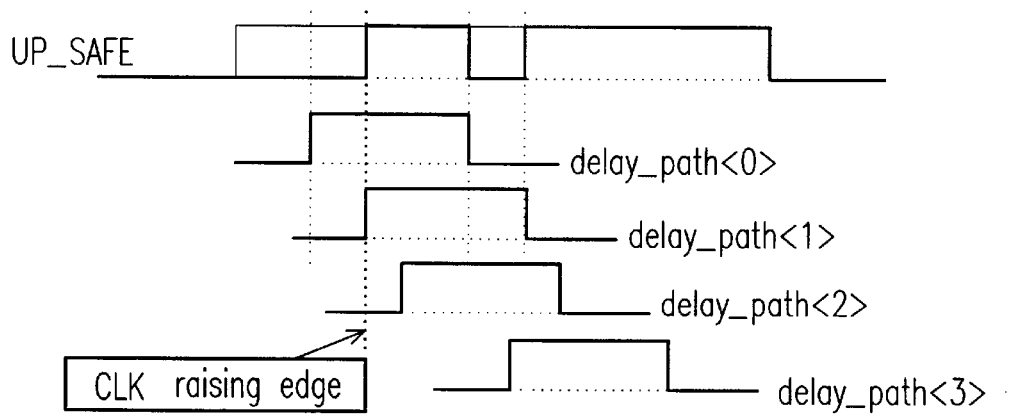
FIG. 5B is a signal waveform diagram showing the timing relationship between various signals used in the circuit of FIG. 5A.

FIG. 5A shows a second example of the ripple-prevention control circuit; and FIG. 5B is a signal waveform diagram showing the timing relationship between various signals used in the circuit of FIG. 5A. As shown, the ripple-prevention control circuit of this example is composed of an up-save logic circuit 500, a selection control circuit 510, and a multiplexer 520. The up-save logic circuit 500 is entirely identical in structure and function as the ripple-prevention control circuit 400 shown in FIG. 4A. The output UP_SAFE signal is switched to high-voltage logic state only when any neighboring pair of the delay paths in the DCO 140 are switched to the same logic state, either high or low. The selection control circuit 510 operates in such a manner that, when the up-trigger signal UP from the programmable frequency comparator 120 is at high-voltage logic state and the output count DOUT from the up-down counter 130 is at high-voltage logic state, its output selection signal SEL_UP is switched to high-voltage logic state. The condition of the SEL_UP signal in high-voltage logic state causes the multiplexer 520 to select the input frequency $S_{input}$ as its output clock signal CLK to the up-down counter 130; otherwise, the multiplexer 520 selects the UP_SAFE signal from the up-save logic circuit 500 as the output clock signal CLK to the up-down counter 130. Moreover, after the up-down counter 130 is started to count in the upward direction, the up-trigger signal UP is deactivated, thus allowing the UP_SAFE signal to be used as the clock signal to the up-down counter 130. This can help prevent the occurrence of ripples.

FIG. 6A shows a third example of the ripple-prevention control circuit; and FIG. 6B is a signal waveform diagram showing the timing relationship between various signals used in the circuit of FIG. 6A. As shown, the ripple-prevention control circuit of this example is composed of a logic control circuit 600 and a multiplexer 610. The multiplexer 610 takes SEL<1:0> as selection signal to select the next delay-path switching signals delay_path<1>, delay_path<2>, or delay_path<3> as the output clock signal CLK to the up-down counter 130 from current state of DOUT 00, DOUT 01 or DOUT 02 during the SEL_UP=1. This can also help prevent the occurrence of ripples. The clock signal CLK equals to Sinput at SEL_UP=0.

The DCO 140

Figure 7:
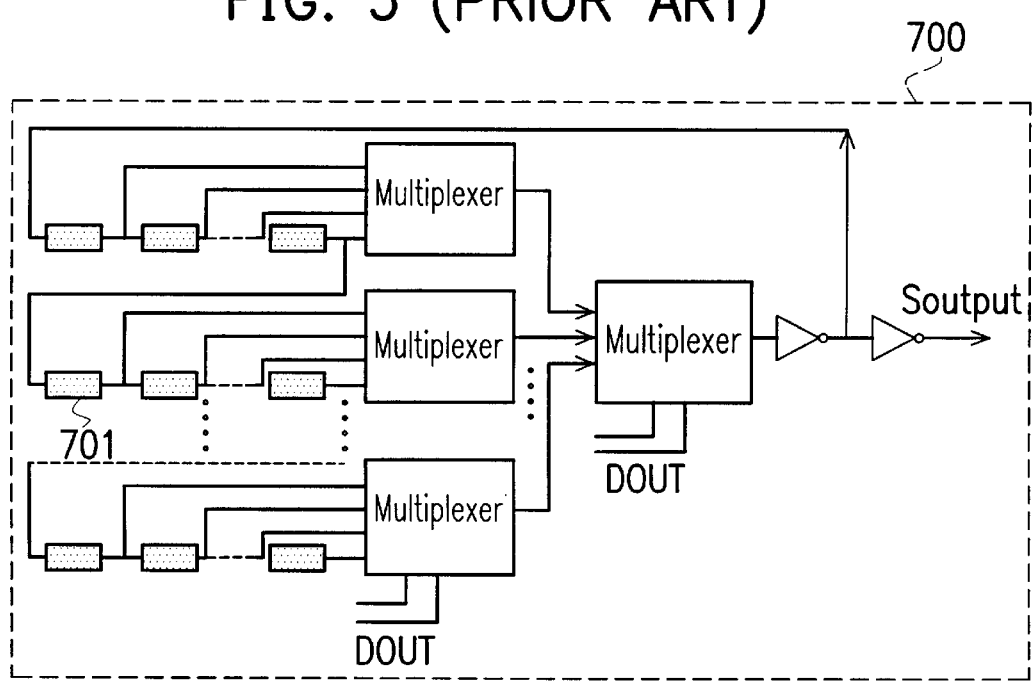
FIG. 7 shows a multi-loop ring oscillator which is utilized as the DCO in the programmable frequency following device of the invention.

The DCO 140 shown in FIG. 1 can be a multi-loop ring oscillator, as the one designated by the reference numeral 700 shown in FIG. 7. This multi-loop ring oscillator 700 is a conventional circuit, so detailed operation thereof will not be described, wherein a delay element is designed by the reference numeral 701.

Figure 8:
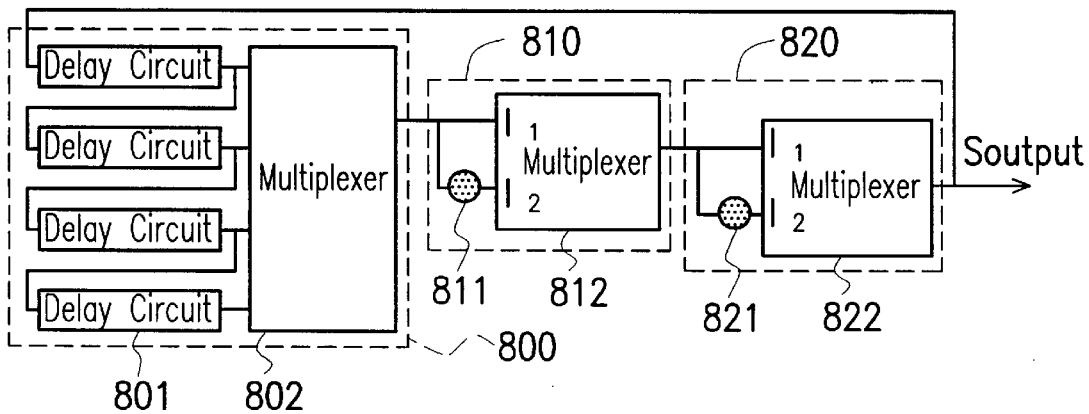
FIG. 8 shows the architecture of the DCO in accordance with the invention.

Alternatively, the DCO 140 shown in FIG. 1 can be the one shown in FIG. 8, which is designed in accordance with the invention for the purpose of preventing the deviation of the output frequency $S_{output}$ due to any variations in manufacture parameters. As shown, this oscillator includes a primitive ring oscillator 800, a first delay unit 810, and a second delay unit 820. The primitive ring oscillator 800 is composed of a plurality of delay circuits 801 and a multiplexer 802. The first delay unit 810 is composed of a delay circuit 811 and a multiplexer 812; and similarly, the second delay unit 820 is composed of a delay circuit 821 and a multiplexer 822. In accordance with the invention, the delay circuits 811, 821 are each designed with a long delay time so as to increase the range of the output frequency $S_{output}$; and the delay circuits 801 is designed with a short delay time so as to increase the accuracy of the output frequency $S_{output}$. In preferred embodiment, for example, the delay circuit 811 in the first delay unit 810 has a delay time of 5 ns (nanosecond); the delay circuit 821 in the second delay unit 820 has a delay time of 10 ns; and the delay circuits 801 in the primitive ring oscillator 800 has a delay time of 0.4 ns. In conclusion, the maximum and minimum bounds of the range of the output frequency $S_{output}$ can be adjusted by varying the delay times of the delay circuits 811, 821 in the first and second delay units 810, 820; while the accuracy of the output frequency $S_{output}$ can be adjusted by varying the delay time of the delay circuits 801 in the primitive ring oscillator 800.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A programmable frequency following device capable of generating an output frequency which is a user-programmable multiple of an input frequency, which comprises:

a frequency divider for dividing the input frequency by a predetermined divisor;

a frequency counter for counting the output frequency of the programmable frequency following device, the frequency counter being reset to 0 after reaching a cycle time of the output frequency from the frequency divider;

a programmable frequency comparator for comparing the output count from the frequency counter with a user-programmable reference value at the time before the frequency counter is reset to 0 in such a manner that if the output count is greater than the reference value, the programmable frequency comparator generates an up-trigger signal; if the output count is less than the reference value, the programmable frequency comparator generates a down-trigger signal;

if the output count is equal to the reference value, the programmable frequency comparator generates a lock signal;

an up-down counter which is capable of increasing its count in response to the up-trigger signal from the programmable frequency comparator, decreasing its count in response to the down-trigger signal from the programmable frequency comparator, and locking its count at current value in response to the lock signal from the programmable frequency comparator; and a DCO whose output frequency is inversely proportional to the output count from the up-down counter, and whose output frequency serves as the output frequency of the programmable frequency following device.

2. The programmable frequency following device of claim 1, wherein the user-programmable reference value is preset through software means.

3. The programmable frequency following device of claim 1, wherein the user-programmable reference value is preset through firmware means.

4. The programmable frequency following device of claim 1, further comprising:

a frequency-doubling circuit coupled between the DCO and the frequency counter, for doubling the output frequency from the DCO before being fed to the frequency counter for frequency counting.

5. The programmable frequency following device of claim 1, further comprising:

a ripple-prevention control circuit capable of generating an up_safe signal to trigger the counting of the up-down counter in the upward direction in such a manner that the up_safe signal is switched to high-voltage logic state only when the programmable frequency comparator issues the up-trigger signal and any neighboring pair of delay paths in the DCO are switched to the same logic state; and the condition of up_safe signal being in high-voltage logic state causing the up-down counter to count in the upward direction.

6. The programmable frequency following device of claim 1, wherein the programmable frequency comparator outputs a lock signal to lock the up-down counter when the output frequency from the DCO reaches an intended value set by the user-programmable reference value.

7. The programmable frequency following device of claim 1, further comprising:

an up-safe logic circuit capable of generating an up_safe signal in such a manner that the up_safe signal is switched to high-voltage logic state only when the programmable frequency comparator issues the up-trigger signal and any neighboring pair of delay paths in the DCO are switched to the same logic state; and the condition of the up_safe signal being in high-voltage logic state causing the up-down counter to count in the upward direction;

a selection control circuit capable of generating an up_selection signal in such a manner that the up_selection signal is switched to high-voltage logic state when the programmable frequency comparator issues an up-trigger signal and any bit of the out-put from the up-down counter is switched to high-voltage logic state; and a multiplexer which operates in such a manner that when the up_selection signal from the selection control circuit is high-voltage logic state, it selects the output up_safe signal from the up-safe logic circuit as clock signal to the up-down counter, and other-wise selects the input frequency as clock signal to the up-down counter.

8. The programmable frequency following device of claim 7, further comprising:

a ripple-prevention control circuit which takes and selects next delay paths in the multiplexer in the DCO ealier than the switching of the output count as the clock signal to the up-down counter from current delay path.

9. The programmable frequency following device of claim 1, wherein the DCO is a multi-loop ring oscillator.

10. The programmable frequency following device of claim 1, wherein the DCO includes: a primitive ring oscillator; a first delay unit coupled to the primitive ring oscillator; and a second delay unit coupled to the first delay unit.

11. A programmable frequency following device capable of generating an output frequency which is a user-programmable multiple of an input frequency, which comprises:

a frequency divider for dividing the input frequency by a predetermined divisor;

a frequency counter for counting the output frequency of the programmable frequency following device, the frequency counter being reset to 0 after reaching a cycle time of the output frequency from the frequency divider;

a preset means for setting a user-programmable reference value;

a programmable frequency comparator for comparing the output count from the frequency counter with a user-programmable reference value at the time before the frequency counter is reset to 0 in such a manner that if the output count is greater than the reference value, the programmable frequency comparator generates an up-trigger signal; if the output count is less than the reference value, the programmable frequency comparator generates a down-trigger signal; and if the output count is equal to the reference value, the programmable frequency comparator generates a lock signal;

an up-down counter which is capable of increasing its count in response to the up-trigger signal from the programmable frequency comparator, decreasing its count in response to the down-trigger signal from the programmable frequency comparator, and locking its count at current value in response to the lock signal from the programmable frequency comparator; and a DCO whose output frequency is inversely proportional to the output count from the up-down counter, and whose output frequency serves as the output frequency of the programmable frequency following device.

12. The programmable frequency following device of claim 11, wherein the preset means is a software preset means.

13. The programmable frequency following device of claim 11, wherein the preset means is a firmware preset means.

14. The programmable frequency following device of claim 11, further comprising:

a frequency-doubling circuit coupled between the DCO and the frequency counter, for doubling the output frequency from the DCO before being fed to the frequency counter for frequency counting.

15. The programmable frequency following device of claim 11, further comprising:

a ripple-prevention control circuit capable of generating an up_safe signal to trigger the counting of the up-down counter in the upward direction in such a manner that the up_safe signal is switched to high-voltage logic state only when the programmable frequency comparator issues the up-trigger signal and any neighboring pair of delay paths in the DCO are switched to the same logic state; and the condition of the up_safe signal being in high-voltage logic state causing the up-down counter to count in the upward direction.

16. The programmable frequency following device of claim 11, wherein the programmable frequency comparator outputs a lock signal to lock the up-down counter when the output frequency from the DCO reaches an intended value set by the user-programmable reference value.

17. The programmable frequency following device of claim 11, further comprising:

an up-safe logic circuit capable of generating an up_safe signal in such a manner that the up_safe signal is switched to high-voltage logic state only when the programmable frequency comparator issues the up-trigger signal and any neighboring pair of delay paths in the DCO are switched to the same logic state; and the condition of the up_safe signal being in high-voltage logic state causing the up-down counter to count in the upward direction;

a selection control circuit capable of generating an up_selection signal in such a manner that the up_selection signal is switched to high-voltage logic state when the programmable frequency comparator issues the up-trigger signal and any bit of the out-put from the up-down counter is switched to high-voltage logic state; and a multiplexer which operates in such a manner that when the up_selection signal from the selection control circuit is high-voltage logic state, it selects the output up_safe signal from the up-safe logic circuit as clock signal to the up-down counter, and other-wise selects the input frequency as clock signal to the up-down counter.

18. The programmable frequency following device of claim 17, further comprising:

a ripple-prevention control circuit which takes and selects next delay paths in the multiplexer in the DCO ealier than the switching of the output count as the clock signal to the up-down counter from current delay path.

19. The programmable frequency following device of claim 11, wherein the DCO is a multi-loop ring oscillator.

20. The programmable frequency following device of claim 11, wherein the DCO includes:

a primitive ring oscillator; a first delay unit coupled to the primitive ring oscillator; and a second delay unit coupled to the first delay unit.

* * * * *